(12) United States Patent
Wirtz et al.

(10) Patent No.: US 8,431,918 B2
(45) Date of Patent: Apr. 30, 2013

(54) ELECTRONIC DEVICE FOR A RECONFIGURABLE LOGIC CIRCUIT

(75) Inventors: Rene Wirtz, Stuttgart (DE); Silvia Rosselli, Mannheim (DE); Gabriele Nelles, Stuttgart (DE); Bjoern Luessem, Dresden (DE)

(73) Assignee: Sony Corporation, Tokyo (JP)

( * ) Notice: Subject to any disclaimer, the term of this patent is extended or adjusted under 35 U.S.C. 154(b) by 69 days.

(21) Appl. No.: 13/056,508

(22) PCT Filed: Jul. 31, 2009

(86) PCT No.: PCT/EP2009/005574
§ 371 (c)(1),
(2), (4) Date: Jan. 28, 2011

(87) PCT Pub. No.: WO2010/015363
PCT Pub. Date: Feb. 11, 2010

(65) Prior Publication Data
US 2011/0127487 A1 Jun. 2, 2011

(30) Foreign Application Priority Data

Aug. 7, 2008 (EP) .................................... 08014162

(51) Int. Cl.
*H01L 29/02* (2006.01)
(52) U.S. Cl.
USPC ........................... 257/2; 257/5; 257/E29.242

(58) Field of Classification Search .................. 257/2, 5, 257/E29.242
See application file for complete search history.

(56) References Cited

U.S. PATENT DOCUMENTS

| 6,881,994 | B2 * | 4/2005 | Lee et al. ...................... 257/296 |
| 2005/0006643 | A1 | 1/2005 | Lan et al. |
| 2005/0208699 | A1 * | 9/2005 | Furkay et al. ................. 438/102 |
| 2007/0103962 | A1 | 5/2007 | Su et al. |
| 2007/0117256 | A1 | 5/2007 | Stewart et al. |
| 2007/0252128 | A1 | 11/2007 | Williams et al. |
| 2008/0054254 | A1 | 3/2008 | Sydorenko et al. |
| 2008/0055987 | A1 | 3/2008 | Ruf et al. |
| 2008/0067555 | A1 | 3/2008 | Beebe et al. |
| 2010/0061132 | A1 * | 3/2010 | Fujisaki et al. ................. 365/51 |
| 2010/0090192 | A1 * | 4/2010 | Goux et al. ........................ 257/4 |

OTHER PUBLICATIONS

U.S. Appl. No. 13/116,690, filed May 26, 2011, Wirtz, et al.
U.S. Appl. No. 12/939,519, filed Nov. 4, 2010, Wirtz, et al.
International Search Report issued Nov. 2, 2009 in PCT/EP09/005574 filed Jul. 31, 2009.

* cited by examiner

*Primary Examiner* — Tan N Tran
(74) *Attorney, Agent, or Firm* — Oblon, Spivak, McClelland, Maier & Neustadt, L.L.P.

(57) ABSTRACT

The invention relates to an electronic device, comprising a field effect transistor and a resistive switch electrically coupled with each other, wherein the resistive switch is configured to be switched between a state of low resistance and a state of high resistance.

13 Claims, 8 Drawing Sheets

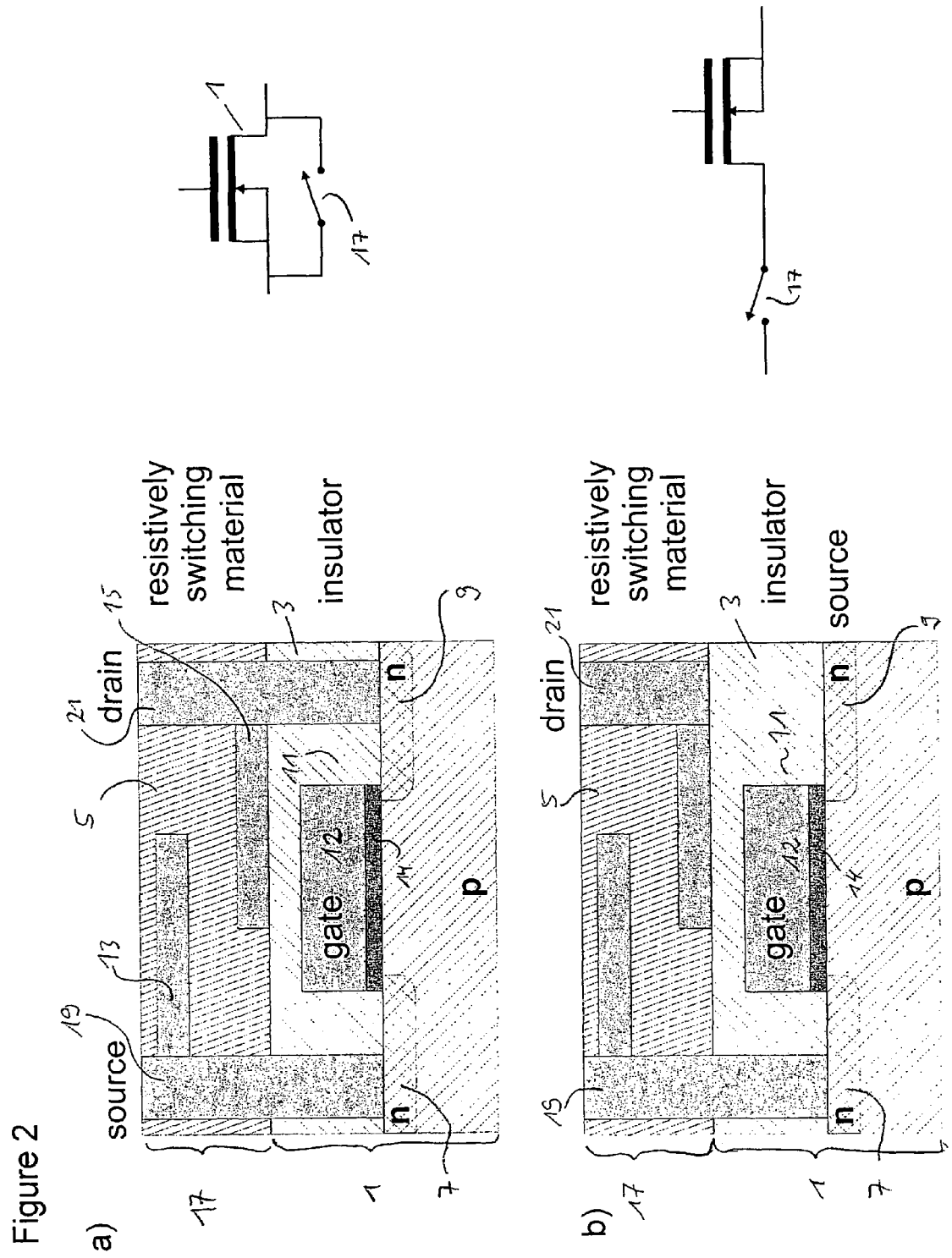

Figure 2 - continued
c)
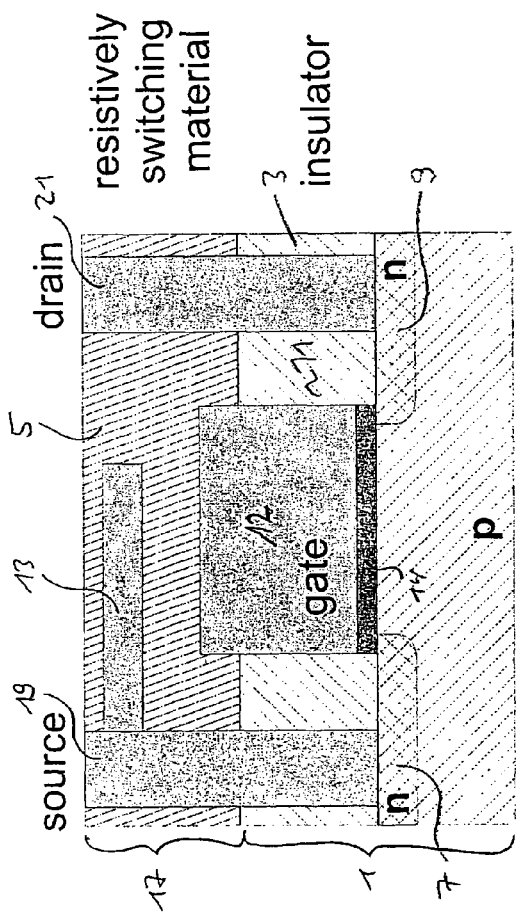
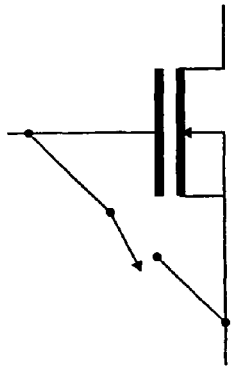
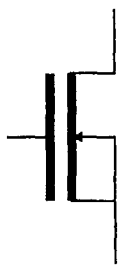 ≡ MOSFET (based on silicon)
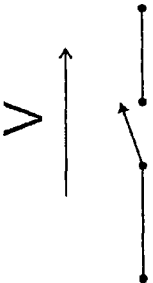 ≡ resistive switch (based on organic or inorganic materials)

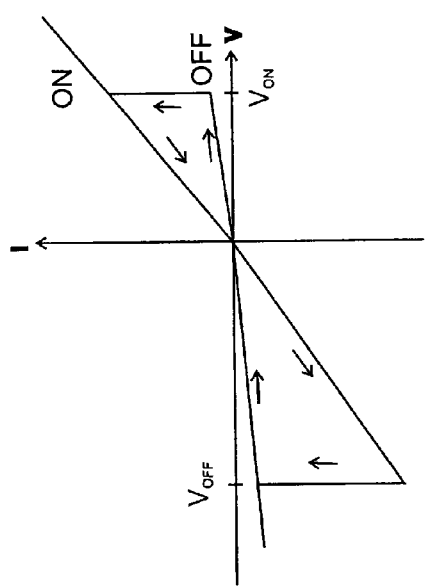
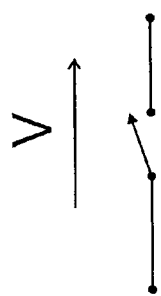
Figure 3

ELECTRONIC DEVICE FOR A RECONFIGURABLE LOGIC CIRCUIT

The present invention refers to electronic devices and, in particular, to electronic devices for a use in a logic circuit such as a field programmable gate array.

The turn-around time of electronics products has shortened continuously since the early '60s of the 20$^{th}$ century. This lead to a shortening of the profit-making period and resulted in an increased demand of re-configurable electronic circuits that allow to shorten the development time for new products and to decrease the production costs [1].

Field-programmable gate arrays (FPGAs) are commonly used to form re-configurable devices. A field-programmable gate array is a semiconductor device containing programmable logic components and programmable interconnects, wherein the programmable logic components can be programmed to perform the function of basic logic gates such as AND, and XOR, or more complex combinational functions such as decoders or mathematical functions. FPGAs can also include memory elements. The programmable interconnects allow an interconnection of the logic components as needed after the FPGA is manufactured, to implement any logical function.

FPGAs are a good compromise between general purpose processors and physically optimized macros [2]. However, the performance of known FPGAs in terms of integration density, speed and energy efficiency is still too low to use them in mass products.

A common programmable logic array (PLA) to implement re-configurability is sketched in FIG. 1. It consists of two crossbars. The upper crossbar is the so-called "AND" plane and the lower crossbar is the "OR" plane. The crossbar consists of diodes. Only at selected junctions are the diodes active, while at other junctions the diodes are de-activated and insulating. Depending on the configuration of the diodes at the crossing points of the crossbars, every Boolean function can be computed. This is illustrated for two logical functions in FIG. 1. The drawback of PLAs is the low-power efficiency. Depending on diode-resistor logic, power is dissipated in the resistances even at static conditions. This precludes the use of PLAs for low-power applications with a high integration density.

A new concept of re-configurable devices was presented in the year 2005 by Likharev et al. [3; 4]. In this concept, CMOS circuits are combined with a molecular crossbar. The CMOS layer consists of many inverters that are connected by small pins to a molecular crossbar, which is deposited on top of the silicon wafer. The molecular layer in the crossbar has the functionality of a switch, i.e. at each crossing point of a top and bottom electrode, the conduction state of the molecular layer can be switched between a conducting and an insulating state. By differently switching at different junctions in the crossbar, this architecture can implement different functionalities. Similar to PLAs the CMOL concept relies on wired OR logic. However, also this logic has a low power efficiency and the implementation of a low power device with high integration density is difficult.

In 2007 a new concept of field-programmable nanowire interconnects (FPNI) to combine CMOS circuits with a crossbar of resistively switching elements was published by Hewlett Packard [5]. This concept is based on the CMOL concept of Likharev et al. As in the CMOL concept, a crossbar of resistively switching elements is deposited on top of a CMOS wafer. Unlike the CMOL concept, the CMOS layer consists not only of inverters but of complete logical functions, e.g. NAND, NOR or buffer cells. The complete logic is computed in the CMOS layer. The crossbar on top of the CMOS layer connects only the different base cells in the silicon wafer.

This concept solves the power-efficiency problem. Due to the use of complete CMOS base cells, these devices are very power-efficient and show a very high integration density. However, the choice of complete unitary cells limits the flexibility of the re-configurable circuit to some extend.

A particular choice of a unitary cell can be most suited for a particular task. However, this may involve the problem that its not suitable or efficient for other tasks.

In particular, if the base cells are kept very simple to keep the logic universal, i.e., if the base cells consist of inverters only, the FPNI concept loses its high integration density, since every electrode of the crossbar can be connected only to a single CMOS base cell. Thus, there is a limited number of connections between CMOS base cells on a given area which might be not sufficient for combining unit cells with a low functionality to obtain the desired functionality of the FPGA. Hence, a high integration density combined with an universal architecture cannot be achieved.

It is the object of the present invention to provide an electronic device for a logic circuit such as a FPGA that permits a high flexibility as a component in a re-configurable circuit and that provides a high integration density.

This object is achieved by an electronic device comprising the features of claim 1 and by a method comprising the features of claim 11. Preferred embodiments of the invention are defined in the dependent claims.

According to the invention, an electronic device is provided that comprises a field effect transistor and a resistive switch electrically coupled with each other, wherein the resistive switch is configured to be switched between a state of low resistance and a state of high resistance.

The resistive switch includes a resistive switching material comprising two stable states which differ in the resistance of the resistively switching material: a low-resistive ("ON") state and a high resistive ("OFF") state. By the application of a positive or a negative voltage pulse, it is possible to switch between these states. The state of the resistively switching material is stored in the material even if no voltage is applied.

Since it is possible to activate or deactivate the device according to the desired functionality depending on the state of the switch, the device can be used in a re-configurable device such as a field-programmable gate array.

Unlike the CMOL or the FPNI concept, a single transistor is combined with a single switch. Hence, the re-configurable element according to the present invention is on the lowest logical level.

According to a preferred embodiment, the electronic device comprises a layered structure and the resistive switch is arranged on top of the field effect transistor. Additionally, an insulator may be provided on the field effect transistor, for example, as part of the field effect transistor, i.e. between the field effect transistor and the resistive switch. This provides an easy-to-manufacture electronic device including a high integration density achieved by a very space-efficient combination of a single resistive switch and a field effect transistor.

According to a further preferred embodiment, the resistive switch is arranged on top of the gate of the field effect transistor and a first contact of the resistive switch is provided on top of the resistive switch opposite to the gate, wherein the first contact is electrically connected to the source or drain of the field effect transistor. Preferably, the first contact is connected to the source or drain of the field effect transistor by means of an interconnect. The interconnect may be arranged perpendicular with respect to the main plane of the device and the field effect transistor.

According to another embodiment, a second contact of the resistive switch is provided between the gate of the field effect transistor and the resistive switch. Preferably, the gate is buried in an insulating layer covering the field effect transistor and preventing a contact with the resistively switching material. According to this embodiment, the first and second contact in combination with a resistively switching material form a switch and the electrical connection of the first contact with the source or drain of the field effect transistor results in a serial connection of the switch and the field effect transistor, in particular, a serial connection of the switch and source and drain of the transistor. Switching the resistive switch on enables an electrical connection to the transistor and, in particular, to its source or drain. Switching the resistive switch off disconnects the transistor.

According to another embodiment the gate electrode of the field effect transistor is formed as a second contact of the resistive switch. By electrically connecting the resistively switching material with the gate and the source or drain of the field effect transistor, a voltage applied between source and gate is dependent on the state of the switch. If the switch is closed, the voltage drop between gate and source is low. Alternatively, if the switch is open, the voltage drop between the gate and source is high. Thus the state of the switch controls the gate-source voltage and also the resistance of the transistor channel between source and drain. It is possible to control large resistance changes between source and drain by small resistance changes of the resistive switch. Hence, the electronic device according to this embodiment can be used as an impedance converter.

According to a further preferred embodiment, the second contact of the resistive switch is also electrically connected with the other of the source and drain contact of the field effect transistor. Hence, a device including a switch that is connected in parallel to a field effect transistor is obtained. Switching the resistive switch on short-circuits the transistor.

Switching the resistive switch off enables a regular operation of the transistor and depending on the state of its gate a current flow between source and drain.

The above electronic devices can be used as a NAND or an NOR gate of a re-configurable circuit.

According to yet another embodiment, the resistive switch comprises a resistively switching material comprising one of a molecular layer and a metal-insulator-metal junction that exhibit resistive switching characteristics.

Furthermore, according to an embodiment a logic circuit is provided that comprises one or more of the above devices that are electrically coupled to each other to form an array of devices such as a FPGA. Logic circuits having different configurations can be achieved with a single type of array by correspondingly switching on or off the resistive switches.

According to another embodiment, the electronic devices are arranged in the array to form one or several NAND and NOR gates.

According to the invention, also a method to manufacture an electronic device is provided. It comprises steps of processing a substrate to produce a field effect transistor; depositing a layer of a resistively switching material on top of the field effect transistor and forming a resistive switch; and providing an electrical contact between at least one of the source and drain and the field effect transistor and the resistive switch.

The method of manufacture according to the invention permits to provide basic elements of a re-configurable circuit such as an FPGA in a very space-efficient way. Furthermore, a NAND gate or another logic circuit with a configurable number of inputs can be built.

According to one embodiment, the method comprises arranging a first electrical contact of the resistive switch on top of the resistively switching material opposite to the gate and forming a first electrical interconnection between the first contact and one of the source and drain of the field effect transistor. Preferably, the interconnection is arranged perpendicular with respect to the main plane of the device.

According to another embodiment, the method comprises arranging a second electrical contact of the resistive switch between the gate and the resistive switch. The second contact can be arranged on top of an insulating layer that covers and isolates the transistor.

According to another embodiment a second electrical interconnection is arranged between the second contact and the other of the source and drain of the field effect transistor. Preferably, also the second interconnection is arranged perpendicular with respect to the main plane of the device.

According to yet another embodiment the method comprises forming the gate electrode of the gate as a second contact of the resistive switch. Preferably, an insulating layer is deposited on the field effect transistor that includes an opening through which the gate electrode can be connected with the resistively switching material. Alternatively, the gate electrode can extend through the opening in the insulating layer and directly contacts the resistively switching material deposited on the insulating layer.

Arranging a contact on top of the resistively switching material opposite to the gate and forming the gate electrode of gate as a second contact of the resistive switch results in a device having a functionality that a voltage drop according to a voltage applied between gate and source is affected by the state of the resistive switch. If the resistive switch is closed, the voltage drop between gate and source is low. Consequently, the resistance between source and drain of the transistor is high if the transistor is used in the linear regime. Alternatively, if the switch is opened, the voltage drop between gate and source is high and the resistance between source and drain is low.

According to a further embodiment, multiple electronic devices are provided and are electrically connected to each other. The fabrication of the multiple electronic devices may be realized simultaneously by known semiconductor processing techniques including lithography. The electronic devices may be electrically connected by arranging them in a programmable logic array (PLA) including crossed bars.

Furthermore, a method of operating an integrated circuit comprising a plurality of electronic devices as described above is provided according to the present invention. The method includes switching the resistive switch of at least one of the electronic devices between a state of low resistance and a state of high resistance in order to deactivate or activate the electronic device. Furthermore, the method includes testing electric parameters of the integrated circuit after the switching process such as current, voltage and logic functions. In response to the testing a further switching of one or more resistive switches may be performed. Subsequently, the integrated circuit may be tested again. These steps may repeated until the integrated circuit has the desired characteristics and functionality.

This method according to the invention is particularly useful for testing prototypes of IC designs. Frequently, a first prototype of a IC does not work as intended because of errors in its design. Usually, these errors can be recognized only when testing the first prototype of the IC design. However, it appears that frequently the errors can be overcome by changing interconnects between the transistors in the IC design to change their logic functions. A change of the complete transistor layout of the ICs is not required. According to the invention errors in prototypes can be eliminated by switching of the resistive switch of a single or several relevant electronic devices.

The method according to the invention reduces the time for testing and revising of IC prototypes, since the number of revised prototypes that needs to be fabricated including the designing and fabrication of a corresponding reworked reticle can be reduced by providing a proto-type according to the invention including switchable interconnects between transistors of an integrated circuit permitting to change the logic functions of the transistors.

Once an optimized working prototype has been achieved, only one single revised reticle may be necessary for a mass production of the integrated circuit. In this integrated circuit some of the resistive switches then can be omitted or some of the resistive switches can by replaced by hardwired interconnects as appropriate.

Further features, characteristics and advantages of the present invention will result from the following description of preferred embodiments of the invention provided in combination with the accompanying drawings. In the drawings:

FIG. 2a shows an electronic device of the present invention according to one embodiment including a resistive switch connected in parallel to a field transistor between source and drain;

FIG. 2b shows an electronic device of the invention according to another embodiment including a resistive switch connected in series to a field effect transistor between source and drain;

FIG. 2c shows another electronic device according to another embodiment of the invention comprising a resistive switch connected in parallel between the gate and source of a field effect transistor;

FIG. 3 shows the main I-V-characteristic of a resistively switching material;

Figure 1:
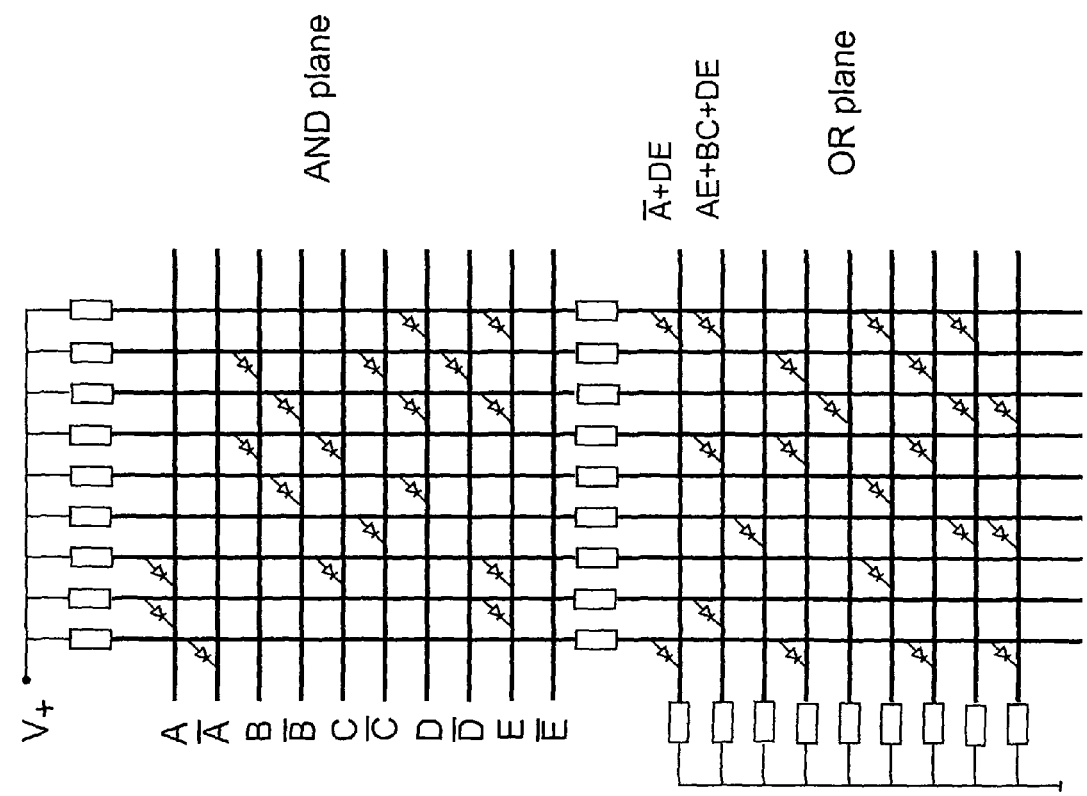
FIG. 1 shows a programmable logic array consisting of two crossbars including an AND plane and an OR plane.
Figure 4:
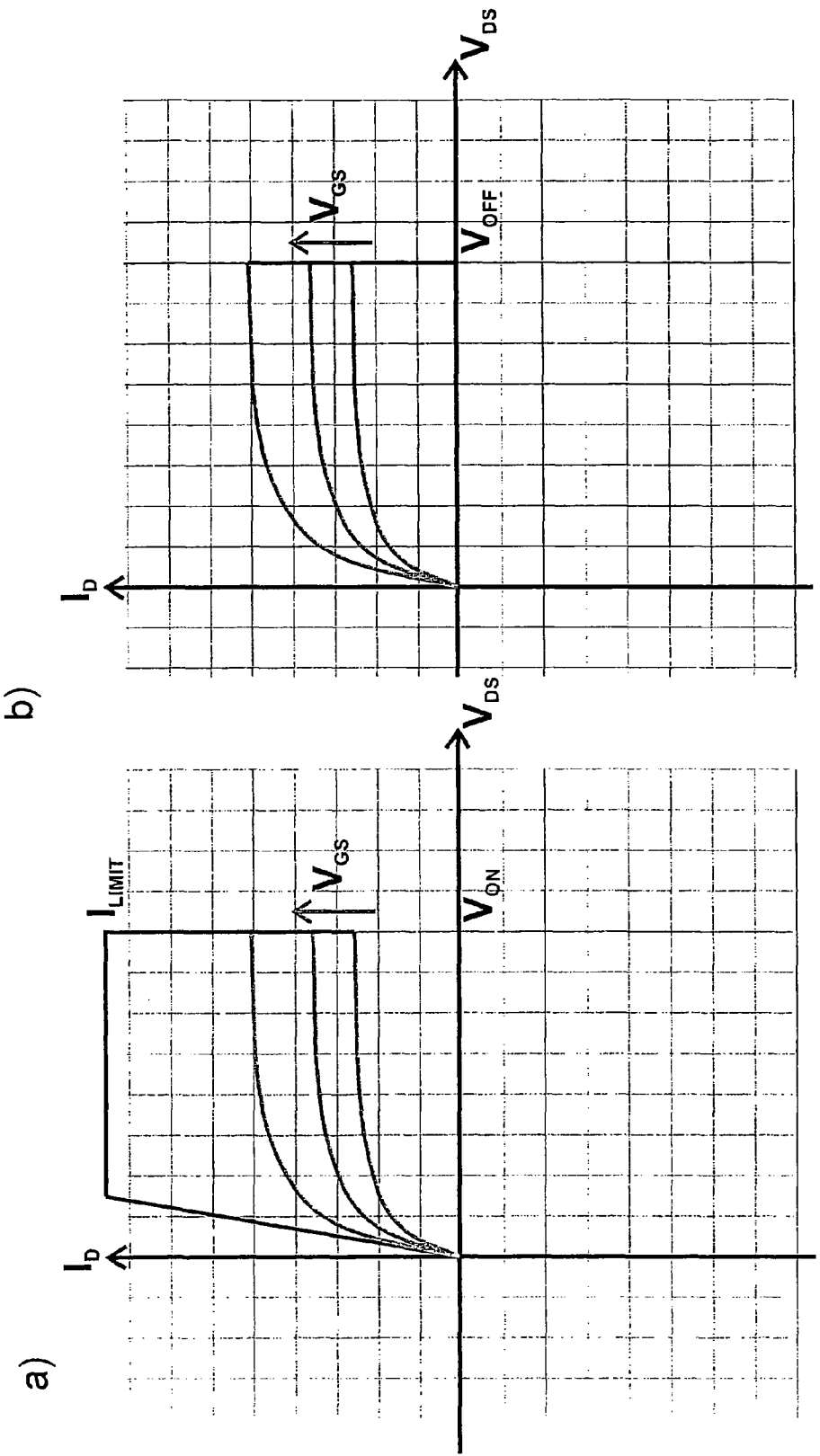
FIG. 4a shows the I-V-characteristic of the electronic device shown in FIG. 2a in a diagram of drain current vs. drain source voltage.
FIG. 4b shows the I-V-characteristics of the electronic device of FIG. 2b in a diagram of drain current vs. drain source voltage.

In the following, embodiments of the present invention are described with reference to FIGS. 2a to 7. In particular, three different implementations or combinations of a resistive switch with a MOSFET are described. Each of these implementations is very space-efficient, since the combination of the switch with the transistor has the same footprint or lateral dimensions as the transistor alone.

In FIGS. 2a-c the underlying layer of the whole structure consists of a conventional silicon n-channel MOSFET 1 formed on a substrate. The transistor (MOSFET 1) is covered by an insulating layer 3 such as $SiO_2$, silicon nitride, silicon-oxy-nitride etc. On top of the insulating layer 3 a thin layer 5 of a resistively switching material is deposited. This layer 5 can consist of a molecular layer or of a metal-insulator-metal (MIM) junction that exhibits resistive switching.

MIM materials exhibiting resistive switching characteristics include simple oxides such as $TiO_2$, $Al_2O_3$, $Ni_2O_3$. Suitable contacts are formed by metals with a high ion mobility like Cu, Au, Ag etc.

The resistive switch may also be formed by a "metal-polymer-metal" material system, wherein the polymer comprises semiconductive characteristics. This material system shows the so called "filament switch effect". Suitable polymers include for example poly(3-hexylthiophene) (P3HT), polyaniline, poly(phenylene vinylene)-disperse red 1 (PPV-DR1), polysiloxane carbazole (PSX-Cz), polypyrrole, poly (o-anthranilic acid) (PARA) and poly(aniline-co-o-anthranilic acid) (PANI-PARA). The polymer is contacted by at least one metal having a high ion mobility like Cu, Au, Ag etc.

The structural formulas of the above mentioned polymers are shown below:

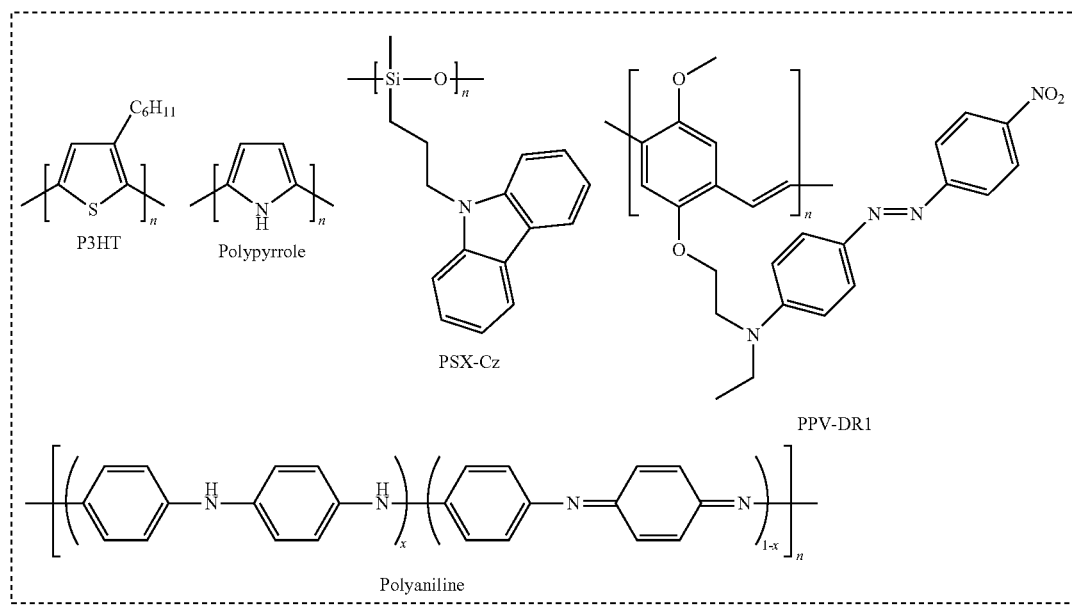

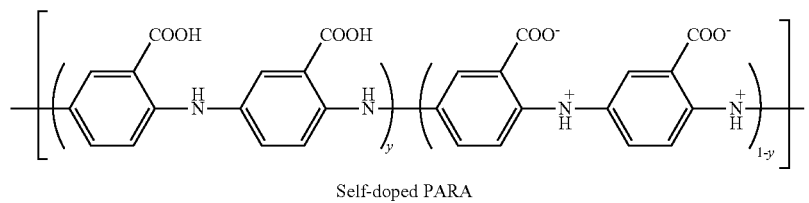

Self-doped PARA

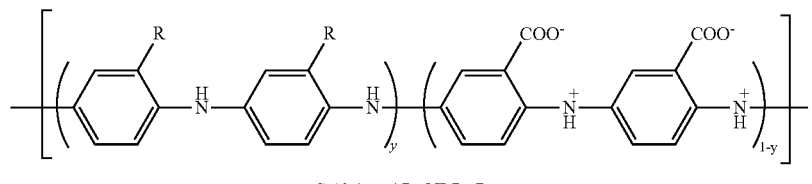

Self-doped PANI-PARA

R:H, COOH

Suitable resistively switching materials also include or consist of materials that exhibit a change of conductivity upon application of an electrical field. Resistively switching materials of this category can be materials that include components that undergo a charge transfer in response to an application of an electric field. This category of materials also includes resistively switching materials that undergo a charge transfer with a connected electrode in response to an application of an electric field. Suitable materials for the electrode include metals like Cu, Au, Ag etc.

Generally, these materials referred to as charge-transfer complexes are electron-donor-electron-acceptor complexes that are characterized by at least one electronic transition to an excited state in which there is a partial transfer of an electronic charge from the donor to the acceptor moiety.

Donor and acceptor molecules in the charge transfer complex are so defined that the highest occupied molecule orbital (HOMO) of the donor and the lowest unoccupied molecule orbital (LUMO) of the acceptor are close enough with each other that upon application of an electric field an electron of the HOMO of the donor can transfer to the LUMO of the acceptor and vice versa depending on the electric field direction.

Donor molecules are molecules that donate electrons during the formation of the charge transfer complex.

Donor molecules can include one or more of the following donor groups without being restricted thereto: $O^-$, $S^-$, $NR_2$, $NAr_2$, $NRH$, $NH_2$, $NHCOR$, $OR$, $OH$, $OCOR$, $SR$, $SH$, $Br$, $I$, $Cl$, $F$, $R$, $Ar$. They can be single molecules, oligomers or polymers.

The resistively switching material can also comprise a donor molecule of one of the following formulas without being restricted thereto:

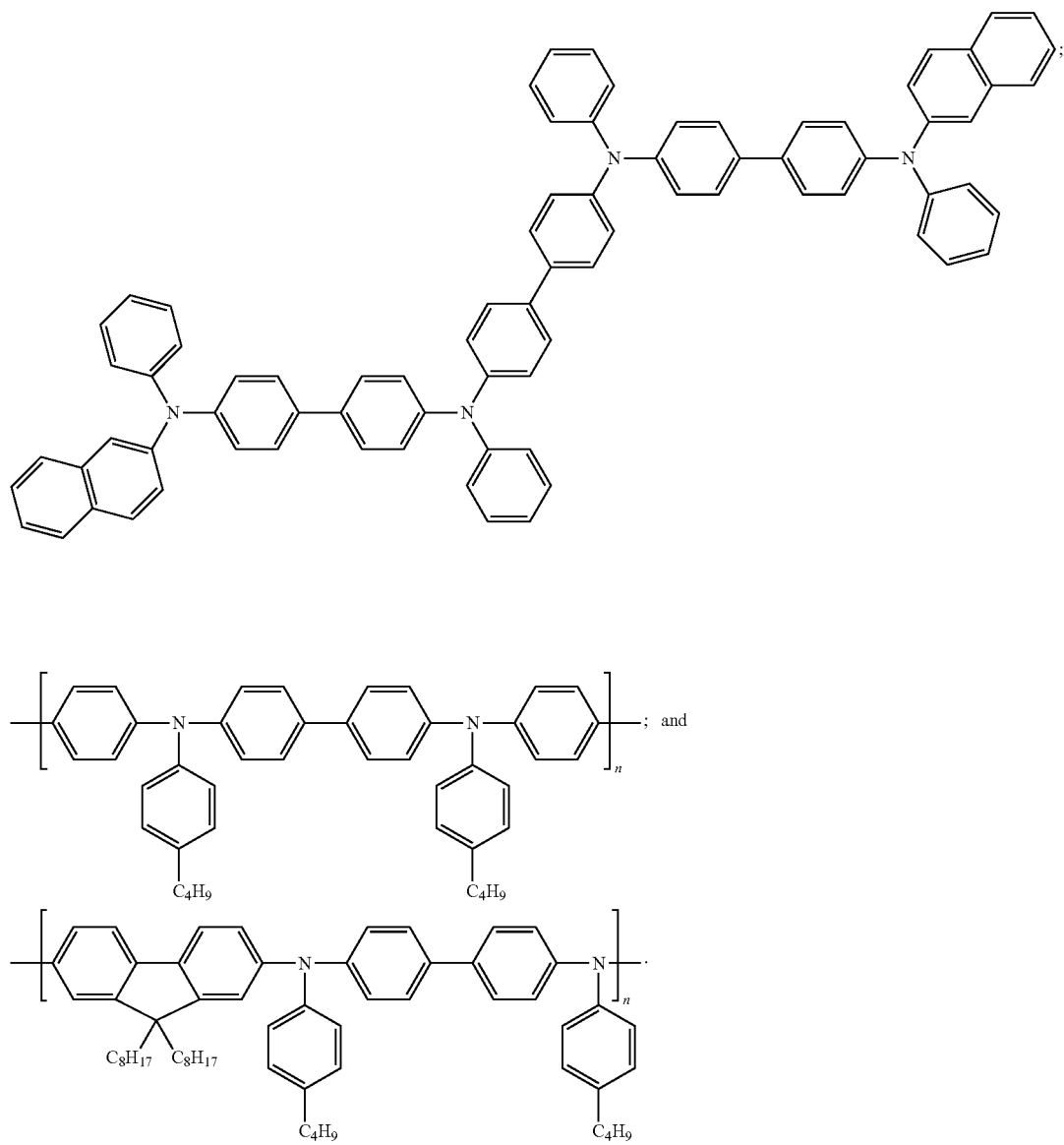

Acceptor molecules are molecules that accept electrons during the formation of a charge transfer complex.

Acceptor molecules can contain one or more of the following acceptor groups without being restricted thereto: $NO_2$, CN, COOH, COOR, $CONH_2$, CONHR, $CONR_2$, CHO, COR, $SO_2R$, $SO_2OR$, NO, Ar. They can be single molecules, oligomers or polymers.

Acceptor molecules are found also among the fullerene derivatives, semiconductor nanodots and electron poor transition metal complexes.

The resistively switching material can comprise an acceptor molecule of the group comprising C60 fullerene, C61 fullerene, CdSe, and platinum octaethyl porphine.

Alternatively, the resistively switching material undergoing a charge transfer in response to an application of an electric field can be a material having conjugated main-chain as well as side-chain liquid crystalline polymers which can be aligned in mono-domain or multi-domain structures.

The resistively switching material can have the following formula without being restricted thereto:

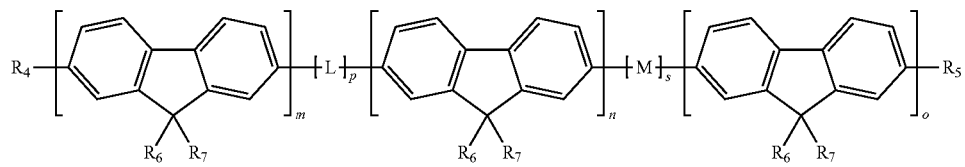

wherein R4 and R5 are independently at each occurrence selected from the group comprising:

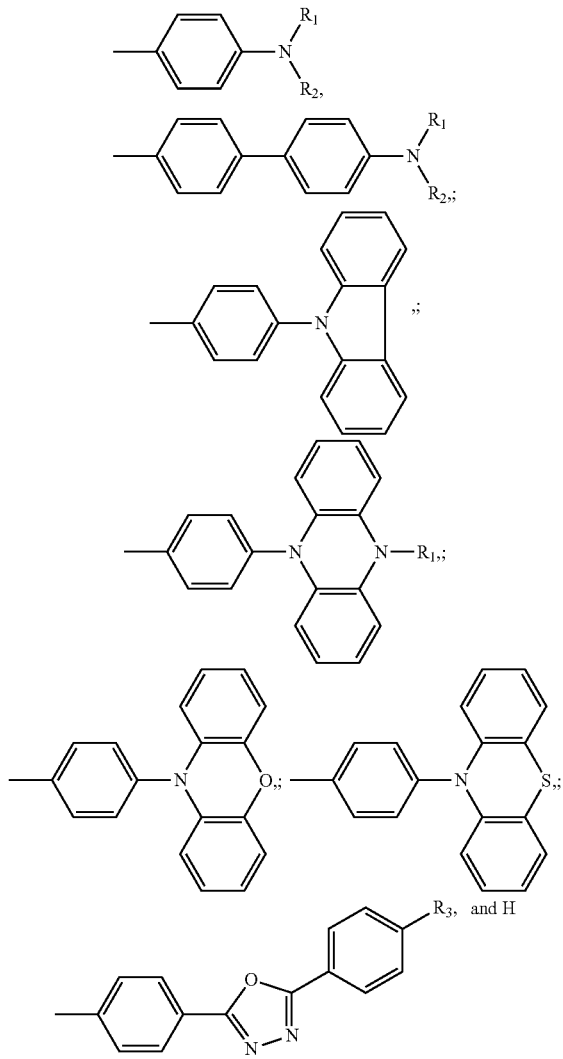

R1 and R2 being independently selected from the group comprising straight chain $C_{1-20}$ alkyl, branched $C_{1-20}$ alkyl, aryl, substituted aryl, alkylaryl, substituted alkylaryl, alkoxyaryl, substituted alkoxyaryl, aryloxyaryl, substituted aryloxyaryl, dialkylaminoaryl, substituted dialkylaminoaryl, diarylaminoaryl and substituted diarylaminoaryl, R3 being selected from the group comprising straight chain $C_{1-20}$ alkyl, branched $C_{1-20}$ alkyl, aryl, substituted aryl, alkylaryl and substituted alkylaryl, and wherein R6 and R7 are independently at each occurrence selected from the group comprising straight chain $C_{1-20}$ alkyl, branched chain $C_{1-20}$ alkyl, aryl, substituted aryl, alkylaryl, substituted alkylaryl, $—(CH_2)_q—(O—CH_2—CH_2)_r—O—CH_3$, q being selected from the range $1<=q<=10$, r being selected from the range $0<=r<=20$, and wherein L and M are independently at each occurrence selected from the group comprising thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein m+n+o<=10, each of m, n, o being independently selected from the range 1-1,000, and wherein p is selected from the range 0-15, and wherein s is selected from the range 0-15, with the proviso that, if R4 is H, R5 is not H, and if R5 is H, R4 is not H.

Alternatively, the resistively switching material can have the following formula without being restricted thereto:

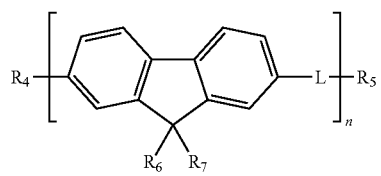

wherein L independently at each occurrence is selected from the group consisting of thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $R_6$ and $R_7$ are independently at each occurrence selected from the group consisting of straight chain $C_{1-20}$, branched chain $C_{1-20}$ alkyl, aryl, substituted aryl alkylaryl, $—(CH_2)_q—(O—CH_2—CH_2)_r—O—CH_3$, q being selected from the range 1-10, r being selected from the range 0-20 and wherein R4 and R5 are independently at each occurrence selected from the group comprising:

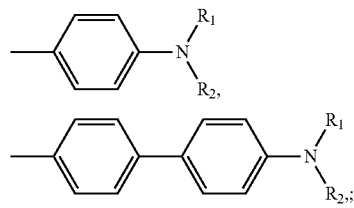

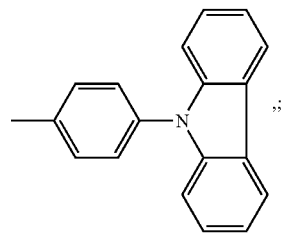

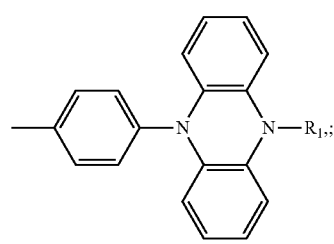

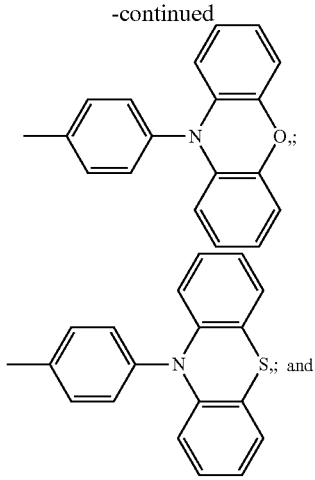
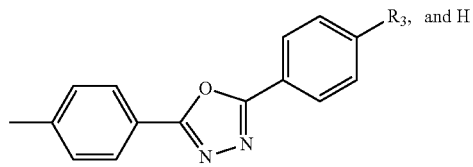
According to another alternative the resistively switching material can have one of the following formulas without being restricted thereto:
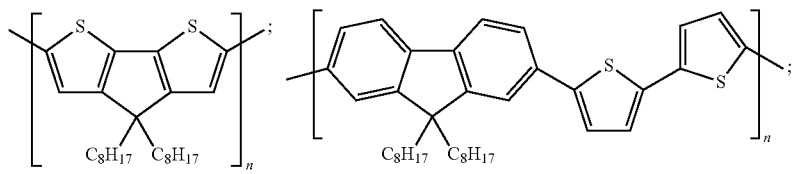
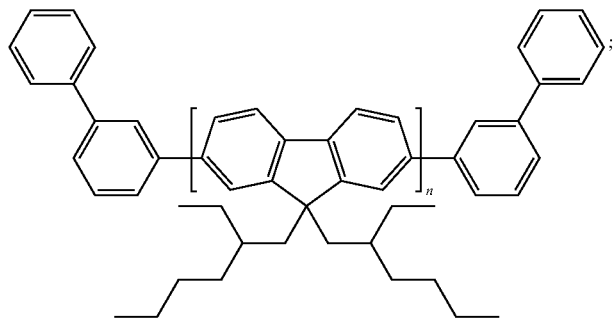
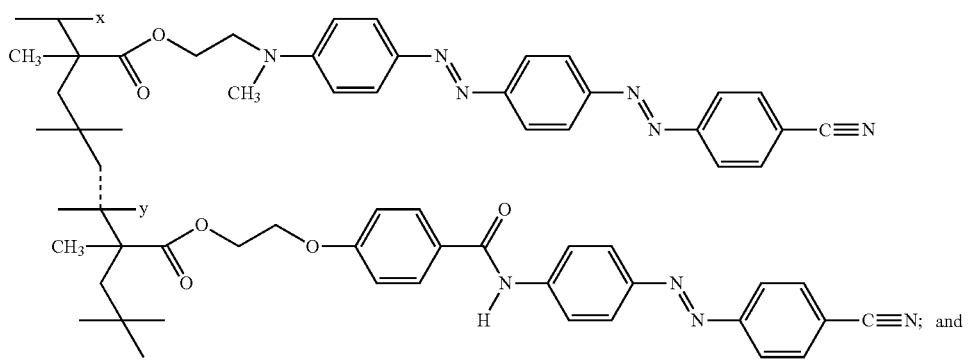

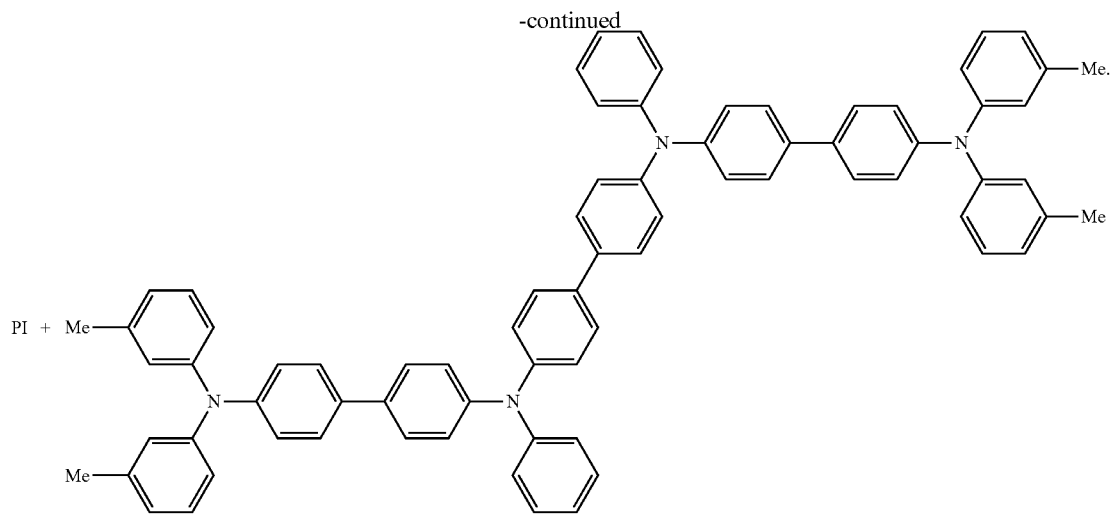

Alternatively, the resistively switching material can be an endcapped polyfluorene of the formula without being restricted thereto:

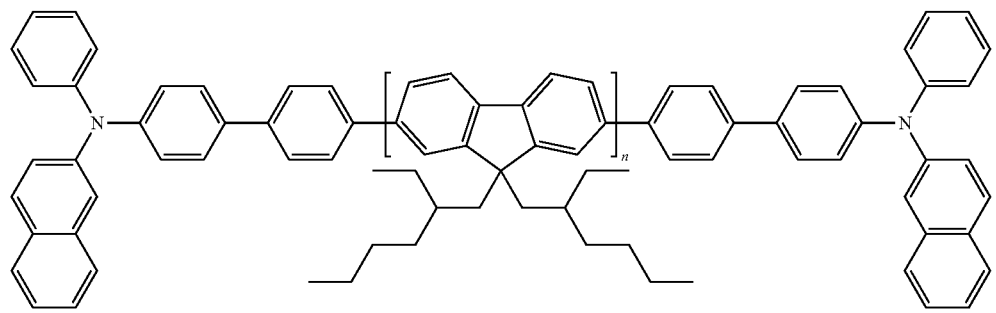

Preferably, the material is aligned on a substrate including a field effect transistor 1 by the use of alignment layers or by other methods such as direct mechanical rubbing, by using an electric field or magnetic field. The alignment results in dipole reorientation and a better charge transfer from the electrode or between the layer components.

For all resistively switching materials described above exhibiting a charge transfer in an electric field, the charge transfer may occur intramolecular or intermolecular to the molecules of the material. A charge transfer may also occur between a molecule and a connected electrode such as the gate electrode 12 of the field effect transistor 1 or the contacts 13, 15.

In an intramolecular charge transfer complex the donor and the acceptor moiety are part of the same molecule. The intramolecular charge transfer molecule can be a single molecule, an oligomer or polymer.

Furthermore, the resistive switching material can also include an electron poor molecule. Generally, electron poor molecules are molecules with electron withdrawing groups (with positive Hammett, δ, constant) and any electron donor groups and transition metal complexes with ligands having electron withdrawing groups directly attached to the metal. They can be single molecules, oligomers or polymers.

The electron poor molecules may be defined by one of the following formulas without being restricted thereto:

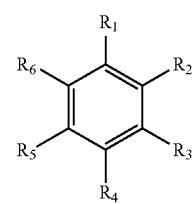

wherein R, $R_1$, $R_2$, $R_3$, $R_4$, $R_5$, $R_6$=C=O, COOH, F, Cl, Br, I, CN, $NO_2$, $NR_3^+$, O—Ar, COOR, OR, COR, SH, SR, $CONH_2$, CONHR, $CONR_2$, CHO, OH, $SO_2R$, $SO_2OR$, NO, C≡CR, Ar; and

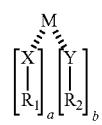

wherein M=transition metal, X, Y=electron withdrawing group like C=O, COOH, F, Cl, Br, I, CN, $NO_2$, $NR_3^+$, N=C, O—Ar, COOR, OR, COR, SH, SR, $CONH_2$, CONHR, $CONR_2$, CHO, C=N, OH, $SO_2R$, $SO_2OR$, NO, C≡CR, Ar and $R_1$, $R_2$=aromatic, allilylic; a, b=integer number.

The electron poor molecule may comprise one of the following formulas without being restricted thereto:

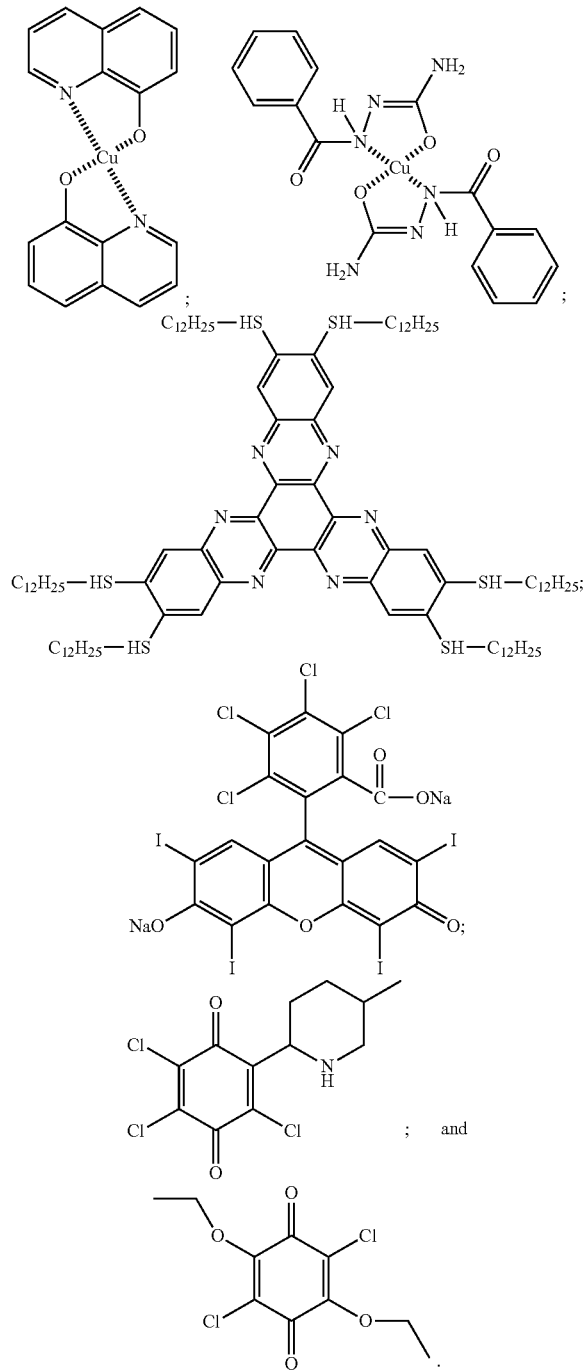

The resistively switching material may comprise a Redox-addressable molecule. Generally, redox addressable molecules are molecules in which the conjugation length and with it the conductivity changes upon chemical reduction or oxidation. They can be single molecules, oligomers or polymers. A typical redox addressable group are the 4,4'bipyridinium salts.

According to one embodiment the Redox-addressable molecules are defined by the formula without being restricted thereto:

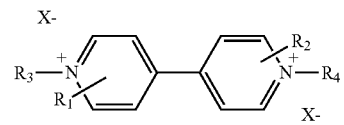

wherein $R_1$, $R_2$, $R_3$, $R_4$=aryl or alkyl X$^-$=anion.

According to a preferred embodiment the Redox-addressable molecule comprises one of the formulas without being restricted thereto:

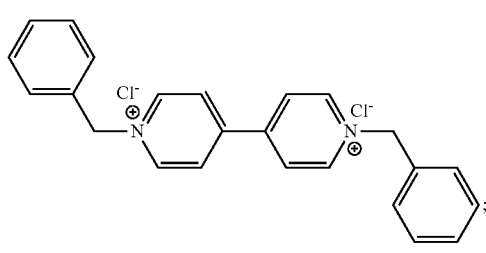

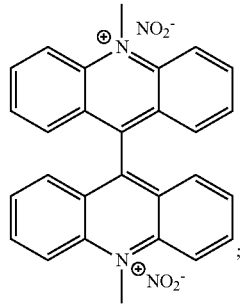

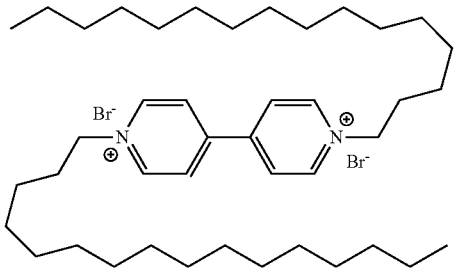

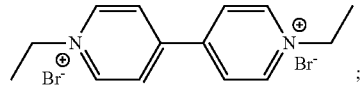

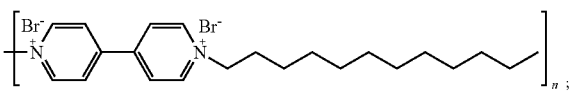

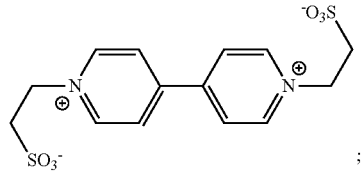

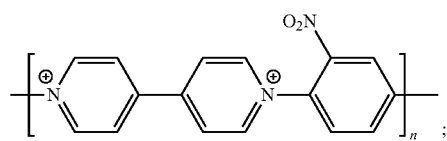

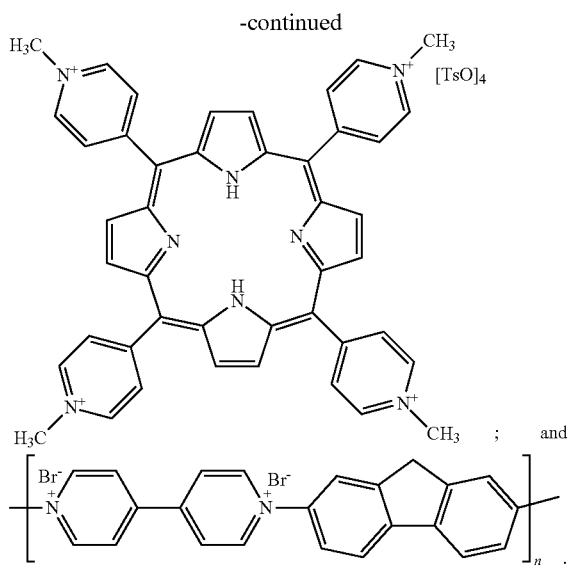

The layer of resistive switching material is usually amorphous and can easily be deposited on top of the MOSFET 1 by using conventional deposition methods such as thermal evaporation, sputtering or spin-coating, by layer by layer deposition, electrostatic self-assembly and Langmuir Blodgett technique etc.

A specific example of a material comprising electron poor molecules are active films of hexaazatrinaphthylene (HATNA) prepared by spin coating of a chloroform solution. The films can be dried under vacuum conditions. Then Aluminium electrodes may be deposited thought a mask (0.25 mm²) to form a complete switch.

Under application of a voltage profile an ON-OFF ratio of 2.3 within 20 cycles could be measured in an experimental setup.

In a redox addressable molecule the injection of electrons by an electric current chemically reduces the molecule and the increased amount of electrons in the π*orbitals increases the conductivity of the material which is transferred from a low conduction state (OFF) to a high conduction state (ON).

Further specific examples of resistively switching materials include a layer of Redox-addressable octadecyl viologen dibromide prepared for example by Langmuir Blodgett technique, a layer of Redox-addressable poly(viologen-co-dodecane) prepared by spin coating of a chloroform/ethanol solution; and a layer of Redox-addressable 1,1'-diethyl-4,4'bipyridinium dibromide prepared by evaporation. Of course these materials can also be prepared with a technique that was indicated in relation with another material.

Further details with respect to materials that can be used as a resistively switching material and their preparation are disclosed in the European patent application EP 07 01 57 11 that is hereby incorporated by reference.

The main characteristic of a resistive switch including a resistively switching material layer is sketched in FIG. 3. The resistive switch comprises two stable states which differ in the resistance of the layer: A low resistive ("ON") state and a high resistive ("OFF") state. By applying a positive or a negative voltage pulse, it is possible to switch between these states. The state of the switch is stored even if no voltage is applied to the switch.

In the case of a charge transfer complex material the process of a conductivity change between the components of the charge transfer complex upon application of an electric field can be explained as follows on a molecular scale: In a low-conductivity state, which can be considered as the "off" state, charge carriers such as electrons occupy the lowest energy levels. Due to an application of an electric field such as a voltage pulse electrons are transferred from a donor molecule to an acceptor molecule. As a result, charge carriers occupy higher energy levels. Thus the material is in a state of high conductivity or "on" state.

Depending on the type of device, the resistive switch 17 is connected with the source 7, drain 9 or gate 11 of field effect transistor.

According to the first alternative shown in FIG. 2a, the resistive switch 17 arranged on top of the field effect transistor 1 comprises two contacts 13, 15 sandwiching the resistive switching material 5. Both contacts 13, 15 that are arranged in parallel to the main plane of the device and overlap each other. The gate 11 of the field effect transistor 1 comprises a gate electrode 12 and a gate oxide 14. The gate 11 is embedded in the insulating layer 3. The gate 11 is contacted from the out-of plane direction. As is visible in FIG. 2a, the switch 17 formed by the resistive switching material 5 and the two contacts 13, 15 have the same footprint and lateral dimensions as the field effect transistor 1 provided under the switch 17.

The switch 17 and in particular its contacts 13, 15 are connected to a first interconnection 19 and a second interconnection 21 that are in electrical contact with the source 7 and the drain 9 of the transistor 1, respectively. As shown in the diagram on the right side of FIG. 2a, this electronic device can be represented by a resistive switch 17 connected in parallel to the field effect transistor 1 between its source 7 and drain 9.

The functionality of the device shown in FIG. 2a can be understood with the aid of a plot of the drain current vs. source voltage shown in FIG. 4a. If the drain-source voltage $V_{DS}$ exceeds the ON switching voltage $V_{ON}$ of the resistive switch 17, the switch 17 turns ON and shortens the MOSFET 1. The device (including the transistor 1 an the switch 17) is now permanently turned on, even without any voltage applied. Only if a negative voltage is applied between source 7 and drain 9 that exceeds $V_{OFF}$, the switch 17 can be switched off again to remove the shorting of the transistor 1. To avoid damages to MOSFET 1 while a negative voltage is applied between source and drain, the MOSFET 1 has to be set to its insulating state by shortening drain and gate (ensuring that the drain-gate voltage is zero).|[1]

According to the device shown in FIG. 2b, a resistive switching material 5 is deposited on top of a field effect transistor 1. Equal to the device shown in FIG. 2a the resistively switching material 5 is sandwiched between two electric contacts 13, 15 to form a switch 17. While the first contact 13 of the switch 17 is electrically connected with the drain contact 7 of the field effect transistor 1 by means of a vertical interconnection 19, the second contact 15 of the switch is not connected to the source 9 of the field effect transistor 1. The vertical interconnection 21 that is in contact with the second contact 15 of the switch 17 extends only between the bottom side of the resistively switching material 5 and the top surface of the device. Consequently, the electronic device shown in FIG. 2b can be described as a resistive switch 17 that is connected in series to a field effect transistor 1 between its source 7, 9 and drain as shown schematically on the right side of FIG. 2b.

The series connection of a resistive switch 17 and a MOSFET 1 functions in a similar way as the electronic device according to FIG. 2a. If the drain source voltage exceeds $V_{OFF}$, the resistive switch opens and permanently disconnects the transistor 1 (its source 7 or drain 9) regardless of the gate voltage (the different orientation of the switch in FIGS.

2a and 2b is to be noted). Only if a large opposite voltage is applied between contacts 21 and 19, can the switch 17 be closed again. This behavior is illustrated in the plot of drain current $I_D$ vs. drain source voltage $V_{DS}$ in FIG. 4b.

As is visible in FIGS. 2a and 2b, the interconnections 19, 21 for contacting the resistive switch 17 and both of the source 7 and drain 9 of the field effect transistor 1 in the case of the device shown in FIG. 2a, or for only connecting the resistive switch 17 with the drain 9 of the field effect transistor 1 without connecting the source 7 of the field effect transistor as shown in FIG. 2b are arranged vertically with respect to the plane of the field effect transistor 1 and the plane of the switch 17 and extend to the top surface of the device where they are exposed.

Accordingly, the switching of the device can be effected by contacting the interconnects 19, 21 on the surface of the device, for example, with electrodes and by applying a positive or negative voltage pulse for switching the transistor 1 "ON" or "OFF".

Figure 5:
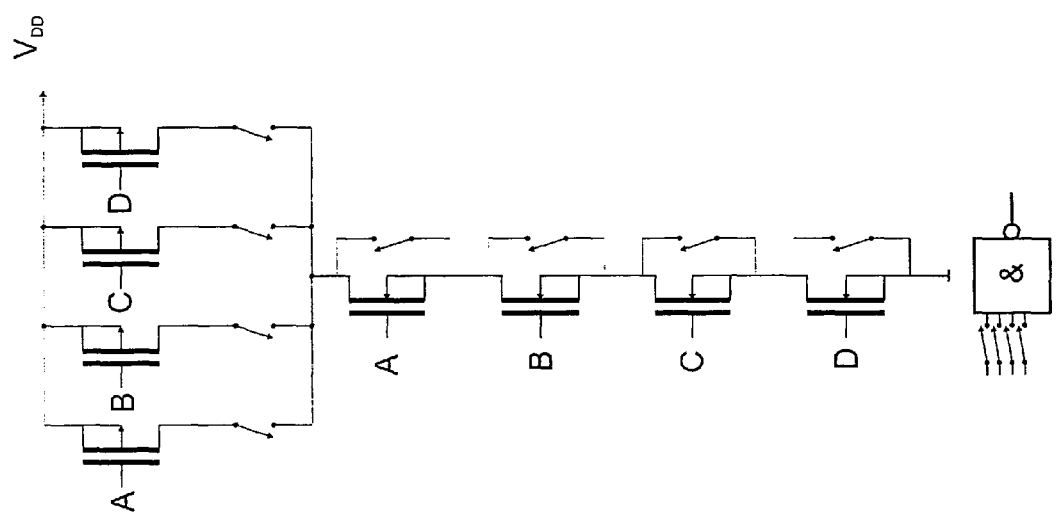
FIG. 5 shows an NAND arranged by an array of re-configurable electronic devices.

The electronic devices described with respect to FIGS. 2a and 2b, i.e. the series connection and the parallel connection of a resistive switch 17 and a transistor 1, represent the most basic elements of a re-configurable circuit. As an example, a NAND gate with a configurable number of inputs can be formed. A corresponding circuit is shown in FIG. 5. Depending on the state of the switches 17, the NAND gate has two, three or four inputs. To disable one input of the NAND gate, the corresponding p-channel transistor has to be disabled, (i.e., the corresponding switch has to be opened) and the n-channel transistor has to be switched on permanently (by closing the corresponding switch).

Figure 6:
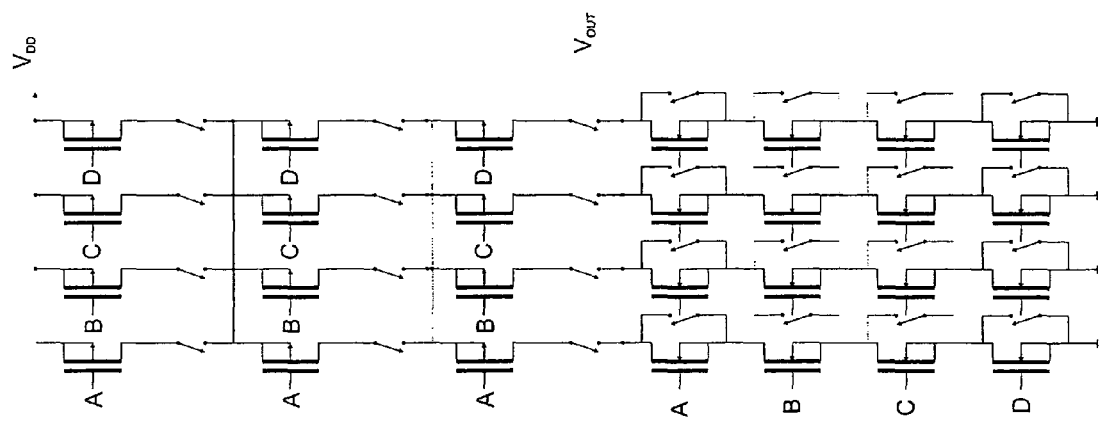
FIG. 6 shows another example of an array of re-configurable circuits including electronic devices shown in FIGS. 2a and 2b.
Figure 7:
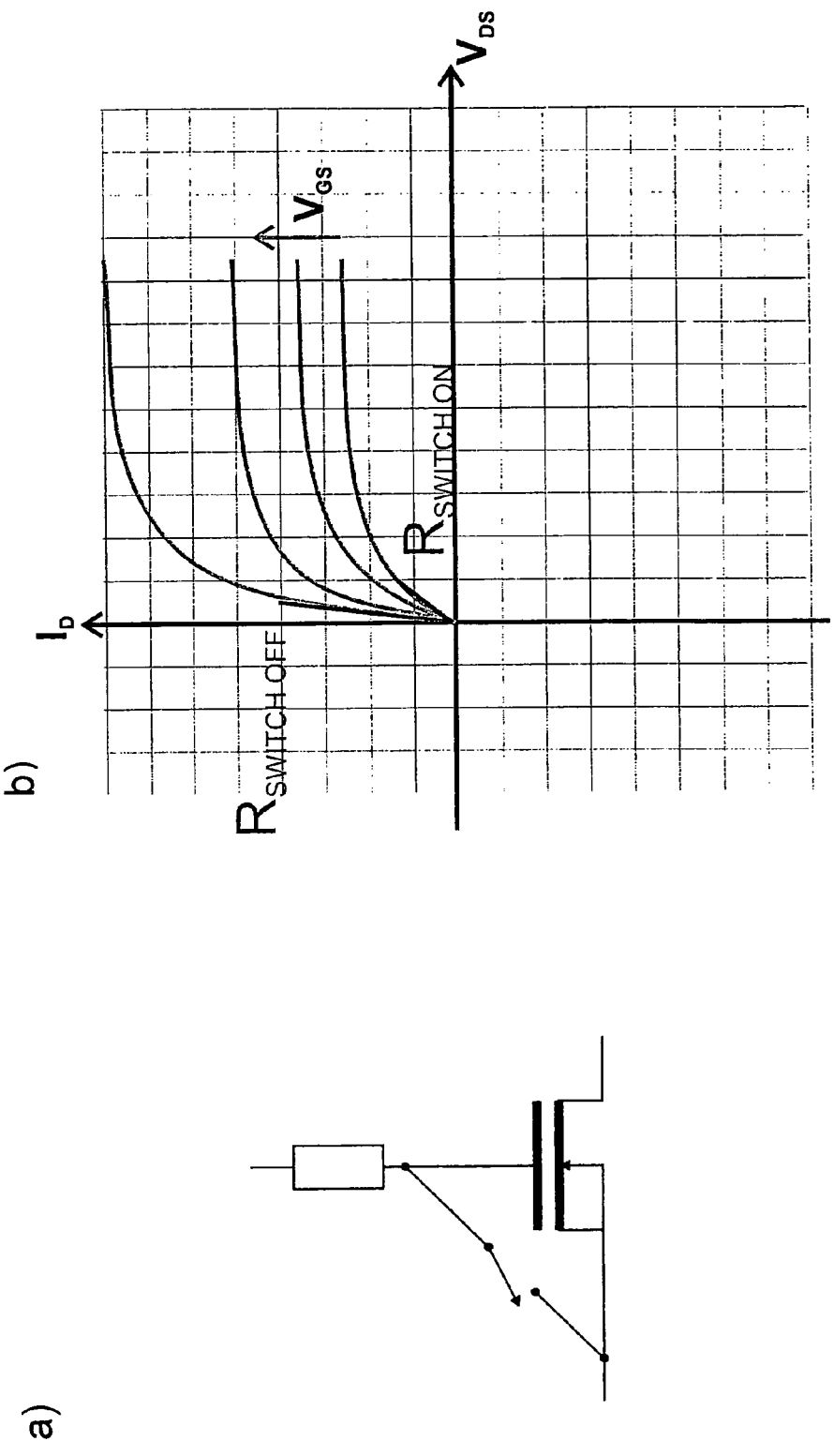
FIG. 7a shows the I-V-characteristics of the device according to FIG. 2c in a diagram of drain current vs. drain source voltage.
FIG. 7b illustrates corresponding I-V-characteristics of the device shown in FIG. 2c.

The NAND circuit of FIG. 5 can be extended to yield a completely re-configurable circuit which can compute every possible Boolean function. One example is shown in FIG. 6. This circuit can, depending on the state of the switches 17, compute three different, freely configurable NAND functions and can connect the NAND functions with AND functions. For example, it can compute the function $X=\overline{AB} \cdot \overline{BC} \cdot \overline{BD}$. Combined with an inverter, this reconfigurable circuit is universal and can compute every possible function. Furthermore, it is power-efficient, because is relies on the CMOS principle that complementary MOSFETs are combined to exclude any current paths from the supply voltage to ground at static conditions. According to the CMOS principle two complementary types of MOSFETs can be combined in such a way that there is at no time a direct current path from the supply voltage to the ground.

Accordingly, the devices shown in FIGS. 2a and 2b combine a high integration density and high power efficiency.

The device shown in FIG. 2c is similar to the devices shown in FIGS. 2a and 2b and does also include a field effect transistor 1 having a resistive switching material formed on top of it. Contrary to the devices shown in FIGS. 2a and 2b, the device of FIG. 2c includes a resistive switching material 5 sandwiched between one contact 13 and the gate electrode 12 of the field effect transistor 1. The device of FIG. 2c does not include a second separate contact of the resistive switching material 5. Instead, the second contact is formed by the gate electrode 12 that extends through the insulating layer 3. Similar to the devices shown in FIGS. 2a and 2b, the first contact 13 of the resistive switching material 5 is connected to the source 7 of the field effect transistor 1 by a vertical interconnection 19.

This structure of the device has the effect that the voltage drop between gate 11 and source 19 is affected by the state of the resistive switch 17. If the resistive switch 17 is closed, only a low voltage drops between gate 11 and source 19 and consequently, the resistance between source 7 and drain 9 of the transistor 1 is high if the transistor 1 is used in the linear regime. Alternatively, if the switch 17 is opened, a large voltage drops between gate 11 and source 7 and the resistance between source 7 and drain 9 is low.

The corresponding I-V-characteristic of the device is shown in FIG. 7b. Hence, it is possible to convert the $R_{OFF}/R_{ON}$ ratio of a resistive switching element. The electronic device shown in FIG. 2c has the function of an impedance converter.

Several modifications can be provided to the shown electronic devices. For example, it is possible to replace the n-channel enhancement transistors shown in the figures by a p-channel enhancement transistor as is already used in the re-configurable NAND gate in FIG. 5. Furthermore, the electrical contact between the switch 17 and the transistor 1 can be realized in many different ways not including the use of vertical interconnects as described above. Also the field effect transistor can be of another type than a MOSFET.

The features described can be of importance for the present invention in any combination.

References:
[1.] Komatsu, H. and Nomura, M. R&D trends of LSI Design technology. Science and Technology Trends—Quarterly Review 16, 61-74. 1-7-2005. National Institute of Science and Technology Policy, Japan.
Ref Type: Electronic Citation
[2.] B. Neumann, T. von Sydow, H. Blume, T. G. Noll, *Advances in Radio Science* 2006, 4 251-257.
[3.] K. K. Likharev, D. B. Strukov, in *Introducing Molecular Electronics* 2007.
[4.] D. B. Strukov, K. K. Likharev, *Nanotechnology* 2005, 16 888-900.
[5.] G. S. Snider, R. S. Williams, *Nanotechnology* 2007, 18 035204.
[6.] J. C. Scott, L. D. Bozano, *Advanced Materials* 2007, 19 1452-1463.
[7.] R. Waser, M. Aono, *Nature Materials* 2007, 6 833-840.

The invention claimed is:

1. An electronic device, comprising:
   a field effect transistor and a resistive switch electrically coupled with each other, the resistive switch being configured to be switched between a state of low resistance and a state of high resistance, wherein
   the resistive switch is arranged on top of an isolating layer covering the gate of the field effect transistor and comprises a layer of a resistive switching material sandwiched between a first contact and a second contact,
   the first contact is provided on top of the resistive switching material opposite the gate, and is electrically connected to one of the source and the drain of the field effect transistor, and
   a layered combination of the resistive switch and the field effect transistor has the same lateral dimensions as the field effect transistor alone.

2. The electronic device of claim 1, wherein the second contact of the resistive switch is provided between the gate of the field effect transistor and the resistive switch.

3. The electronic device of claim 2, wherein the second contact is electrically connected with the other of the source and drain contact of the field effect transistor.

4. The electronic device of claim 1, wherein the resistive switching material is one of a molecular layer and a metal-insulator-metal junction that exhibits resistive switching characteristics.

5. The electronic device of claim 1, wherein the electrical connection between the first contact and the one of the source and drain of the field effect transistor extends in a direction perpendicular with respect to the main plane of the electronic device.

6. A logic circuit comprising at least two of the electronic devices of claim 1 electrically coupled to each other to form an array of electronic devices.

7. The logic circuit of claim 6, wherein the electronic devices are arranged to form one or several of NAND and NOR gates.

8. An electronic device, comprising:
a field effect transistor and a resistive switch electrically coupled with each other, the resistive switch being configured to be switched between a state of low resistance and a state of high resistance, wherein
the resistive switch is arranged on top of the gate of the field effect transistor and comprises a resistive switching material sandwiched between the gate and a first contact of the resistive switch which is provided on top of the resistive switching material opposite to the gate,
the first contact is electrically connected to one of the source and drain of the field effect transistor, and
the gate electrode of the field effect transistor is formed as a second contact of the resistive switch.

9. The electronic device of claim 8, wherein the resistive switch comprises a resistive switching material that is one of a molecular layer and a metal-insulator-metal junction that exhibits resistive switching characteristics.

10. The electronic device of claim 8, wherein an electrical interconnection is arranged between the first contact and one of the source and drain of the field effect transistor that extends in a direction perpendicular with respect to the main plane of the electronic device.

11. A logic circuit comprising at least two of the electronic devices of claim 8 electrically coupled to each other to form an array of electronic devices.

12. The logic circuit of claim 11, wherein the electronic devices are arranged to form one or several of NAND and NOR gates.

13. The electronic device of claim 1, wherein the resistive switch has the same footprint as the field effect transistor.

* * * * *